(12) United States Patent
Wang

(10) Patent No.: US 9,202,942 B2
(45) Date of Patent: Dec. 1, 2015

(54) CONNECTOR OF CONNECTING LIGHT SENSOR AND SUBSTRATE AND METHOD OF FABRICATING LIGHT SENSOR

(71) Applicant: PixArt Imaging Inc., Hsin-Chu (TW)

(72) Inventor: Wei-Chung Wang, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/534,187

(22) Filed: Nov. 6, 2014

(65) Prior Publication Data

US 2015/0064833 A1    Mar. 5, 2015

Related U.S. Application Data

(62) Division of application No. 12/717,927, filed on Mar. 4, 2010, now Pat. No. 8,913,034.

(60) Provisional application No. 61/180,890, filed on May 25, 2009.

(30) Foreign Application Priority Data

Nov. 4, 2009   (TW) .............................. 098137412 A

(51) Int. Cl.
  *H01L 31/0203* (2014.01)
  *G06F 3/042* (2006.01)
  *G01J 1/02* (2006.01)
  *G01J 1/04* (2006.01)
  (Continued)

(52) U.S. Cl.
  CPC ........... *H01L 31/0203* (2013.01); *G01J 1/0295* (2013.01); *G01J 1/0411* (2013.01); *G01J 1/42* (2013.01); *G06F 3/0428* (2013.01); *H01L 31/02325* (2013.01); *H01L 2224/16225* (2013.01); *H01L 2224/32225* (2013.01); *H01L 2224/48091* (2013.01); *H01L 2224/73204* (2013.01); *H01L 2224/92125* (2013.01); *H01L 2224/92247* (2013.01)

(58) Field of Classification Search
  CPC ..................... H01L 31/0203; H01L 31/02325; G01J 1/42; G01J 1/0295; G01J 1/0411
  USPC ........................................................... 438/65
  See application file for complete search history.

(56) References Cited

U.S. PATENT DOCUMENTS

| 4,968,266 A | 11/1990 | Yamamoto |
| 6,774,310 B1 | 8/2004 | Dishongh |
| 7,042,444 B2 | 5/2006 | Cok |

(Continued)

FOREIGN PATENT DOCUMENTS

| CN | 1391124 A | 1/2003 |
| CN | 1487403 A | 4/2004 |

(Continued)

*Primary Examiner* — Karen Kusumakar
*Assistant Examiner* — Adam S Bowen
(74) *Attorney, Agent, or Firm* — Winston Hsu; Scott Margo

(57) ABSTRACT

A connector of connecting a light sensor and a substrate is utilized for rotating the light sensor so that the light-receiving direction of the light sensor is parallel with the substrate. When the connector is utilized in an optical touch system, the light sensor can be disposed on the substrate of the optical touch system by means of general manufacturing facilities of flat display panels. Meanwhile, the light-receiving direction of the light sensor is parallel with the substrate of the optical touch system.

7 Claims, 10 Drawing Sheets

(51) Int. Cl.
*G01J 1/42* (2006.01)
*H01L 31/0232* (2014.01)

(56) References Cited

U.S. PATENT DOCUMENTS

| | | |
|---|---|---|
| 2001/0043188 A1 | 11/2001 | Nakamura |
| 2003/0102424 A1* | 6/2003 | Izumi et al. ............. 250/208.1 |
| 2004/0066379 A1 | 4/2004 | Ise |
| 2005/0270666 A1 | 12/2005 | Loh |
| 2006/0226452 A1* | 10/2006 | Yamaguchi ............. 257/231 |
| 2006/0232830 A1* | 10/2006 | Kobayashi ............. 358/448 |
| 2007/0019952 A1* | 1/2007 | Fujimori ............. 396/529 |
| 2007/0200212 A1* | 8/2007 | Cheng ............. 257/678 |
| 2009/0058833 A1 | 3/2009 | Newton |
| 2009/0213094 A1* | 8/2009 | Bridger ............. 345/175 |
| 2010/0134441 A1 | 6/2010 | Chen |

FOREIGN PATENT DOCUMENTS

| | | |
|---|---|---|
| JP | 200226301 A | 1/2002 |
| JP | 2004512657 A | 4/2004 |
| JP | 2006244192 A | 9/2006 |
| JP | 2006351388 A | 12/2006 |
| TW | 200500922 | 1/2005 |
| TW | M357662 | 5/2009 |
| WO | 0235655 A2 | 5/2002 |
| WO | 0235655 A3 | 5/2002 |

* cited by examiner

CONNECTOR OF CONNECTING LIGHT SENSOR AND SUBSTRATE AND METHOD OF FABRICATING LIGHT SENSOR

CROSS REFERENCE TO RELATED APPLICATIONS

This patent application is a divisional application of and claims priority to U.S. patent application Ser. No. 12/717,927, filed on Mar. 4, 2010, and entitled "Connector of connecting light sensor and substrate and method of fabricating light sensor". Patent application Ser. No. 12/717,927 claims the benefit of U.S. Provisional Application No. 61/180,890, filed on May 25, 2009. The entire contents of which are incorporated herein by reference.

BACKGROUND OF THE INVENTION

1. Field of the Invention

The present invention is related to a connector, and more particularly, to a connector of connecting a light sensor.

2. Description of the Prior Art

The optical touch system comprises a display panel, a transparent substrate, a light sensor, and a location-calculating circuit. In general, the transparent substrate is a glass substrate. More particularly, the transparent substrate is an ITO (Tin-doped Indium Oxide) glass. The display panel displays images through the transparent substrate. The light sensor is a chip module disposed on the transparent substrate, and the light-receiving direction of the light sensor has to be parallel to the substrate for detecting if an indicating object (for example, a finger or a stylus) is on the transparent substrate, and accordingly generating a light-sensing signal. The light-sensing signal includes information of a sensed image with a range covering the indicating object. The information of the light sensing signal may be the distance and the angle between the indicating object and the light sensor. In addition, the light sensor includes a transmission port for transmitting the light-sensing signal to the location-calculating circuit. In this way, the location-calculating circuit calculates the location of the indicating object on the display panel according to the light-sensing signal.

In the prior art, when a chip module is disposed on a glass substrate, the chip module is disposed on a flexible printed circuit board (FPC) by Tape Carrier Package (TCP) or Chip on Film (COF) at first, and then the FPC is coupled to the glass substrate, for example, by pressure wielding. However, when the light sensor is disposed on the substrate by means of the above-mentioned method, the light-receiving direction of the light sensor is limited. More particularly, when the light sensor is packaged on the FCB by the above-mentioned method, the light-receiving direction of the FCB is vertical to the substrate, as shown in FIG. 1. Thus, when the FCB is coupled to the substrate, the light-receiving direction of the light sensor is vertical to the substrate. In other words, when the light sensor is disposed on the glass substrate by the conventional package methods (TCP or COF), the light-receiving direction of the light sensor is vertical to the glass substrate, making the light sensor not able to detect if an indicating object contacts the display panel. In the prior art, the FCB may be bended for rotating the light-receiving direction of the light sensor, but such process wastes time and the yield rate of the process is not easily controlled, increasing the cost of the optical touch system.

SUMMARY OF THE INVENTION

The present invention provides a connector of connecting a light sensor and a substrate. The connector is utilized for rotating the light sensor so that a light-receiving direction of the light sensor is parallel to the substrate. The substrate is a glass. The light sensor is utilized for receiving light so as to generate a light-sensing signal. The light sensor has a transmission port for transmitting the light-sensing signal. The light sensor applied in an optical touch system. The optical touch system has a display panel and a location-calculating circuit. The display panel displays images through the substrate. The location-calculating circuit calculates a location of an indicating object on the display panel according to the light-sensing signal. The connector comprises a body and a connecting port. The body is utilized for containing the light sensor, and rotating the light sensor so as to change the light-receiving direction of the light sensor to be parallel to the substrate. The connecting port is contained in the body. The connecting port is coupled to the transmission port of the light sensor for the light sensor being coupled to the substrate through the transmission port and the connecting port.

The present invention further provides an optical touch system. The optical touch system comprises a substrate, a display panel, a light-sensing module, and a location-calculating circuit. The substrate is a glass. The display panel is utilized for displaying images through the substrate. The light-sensing module is utilized for receiving light so as to detect an indicating object, and accordingly generate a light-sensing signal. The light-sensing module comprises a light sensor, and a connector. The light sensor is utilized for receiving light so as to generate the light-sensing signal. The light sensor comprises a transmission port for transmitting the light-sensing signal. The connector comprises a body, a connecting port, and a flexible printed circuit board. The body is utilized for containing the light sensor, and rotating the light sensor so as to change a light-receiving direction of the light sensor to be parallel to the substrate. The connecting port is contained in the body and is coupled to the transmission port of the light sensor. The flexible printed circuit board has a flexible-board connecting port for coupling the connecting port of the connector to the substrate. The location-calculating circuit is utilized for calculating a location of the indicating object on the display panel according to the light-sensing signal.

The present invention further provides a method of fabricating a light sensor. The light sensor has a sensing unit and a lens. The sensing unit is utilized for receiving light so as to generate a light-sensing signal. The sensing unit has a transmission end for transmitting the light-sensing signal. The lens is utilized for focusing light on the sensing unit. The light sensor is applied in an optical touch system. The optical touch system has a substrate, a display panel, and a location-calculating circuit. The substrate is a glass. The display panel displays image through the substrate. The location-calculating circuit calculates a location of an indicating object on the display panel according to the light-sensing signal. The light sensor is contained in a connector. The connector rotates the light sensor so as to change a light-receiving direction of the light sensor to be parallel to the substrate, and the connector prevents the light sensor from high temperature fabrication. The method comprises filling an underfill between the sensing unit and a carrying component for fixing the sensing unit to the carrying component, attaching the lens on the sensing unit, and filling a fixing component around the sensing unit and the lens for packaging the sensing unit and the lens.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a connector of connecting the light sensor and the substrate. The connector provided by the present invention rotates the light sensor so as to change the light-receiving direction of the light sensor to be parallel to the substrate. In this way, when the light sensor is disposed on the substrate by means of the connector of the present invention, the light-receiving direction of the light sensor is parallel to the substrate.

Figure 1:
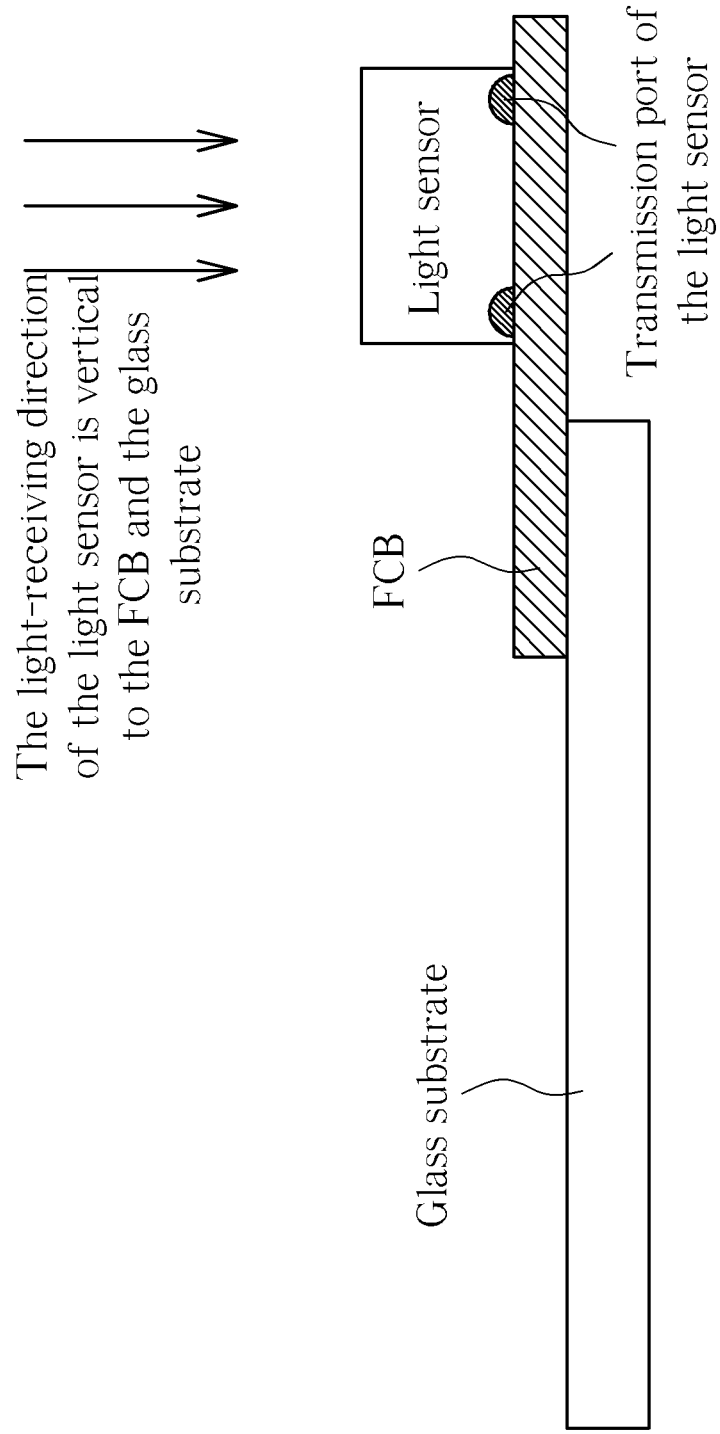
FIG. 1 is a diagram illustrating that the light-receiving direction of the light sensor is vertical to the glass substrate.
Figure 2:
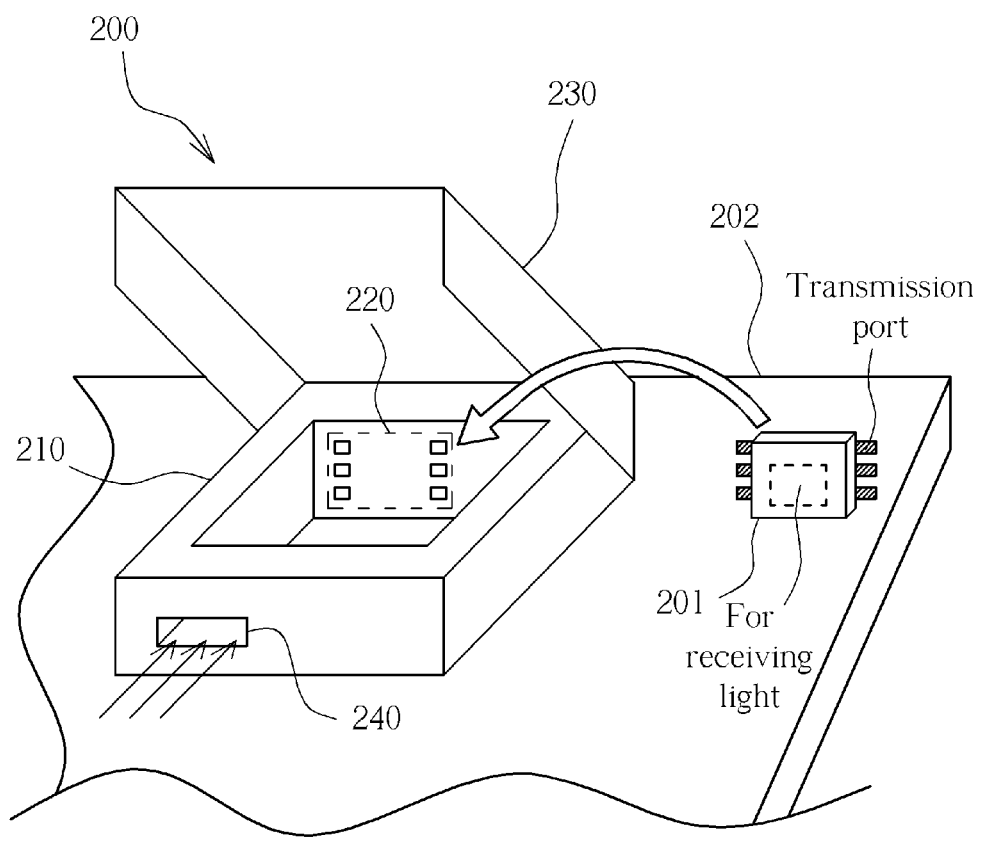
FIG. 2 is a diagram illustrating a connector according to a first embodiment of the present invention.
Figure 3:
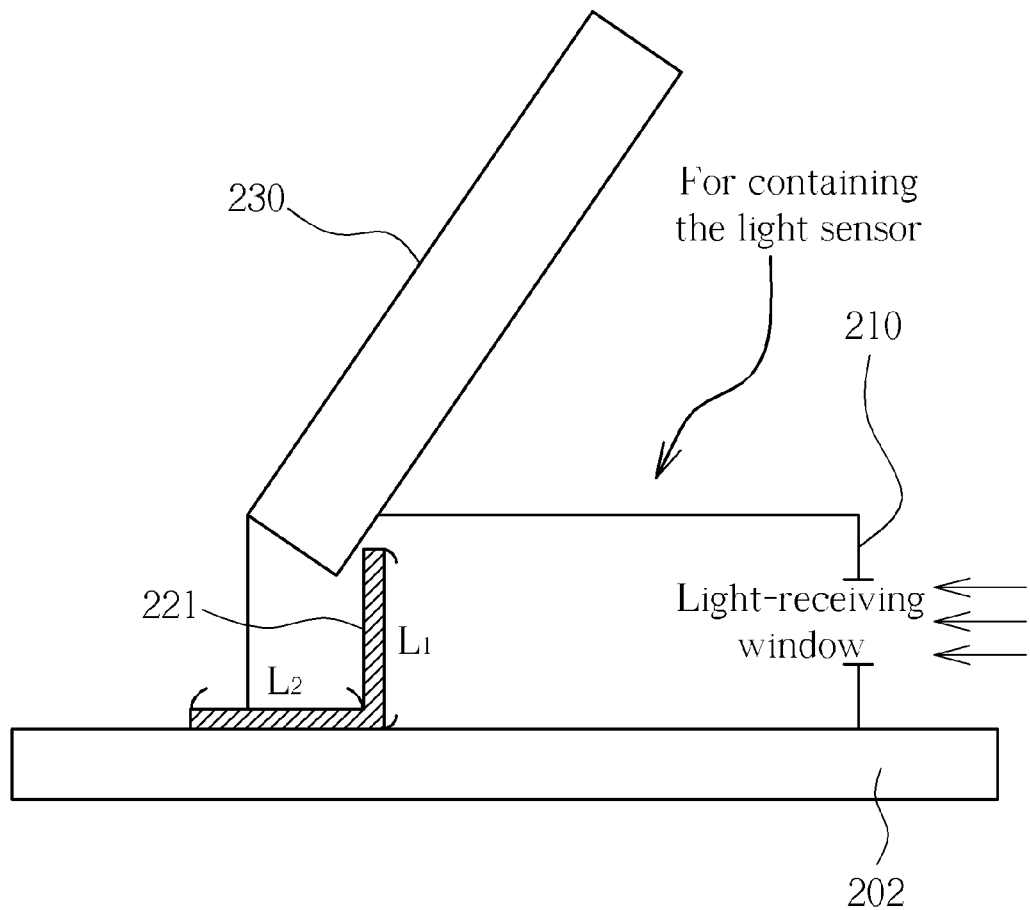
FIG. 3 and FIG. 4 are diagram illustrating the connecting port of the connector of the present invention.
Figure 4:
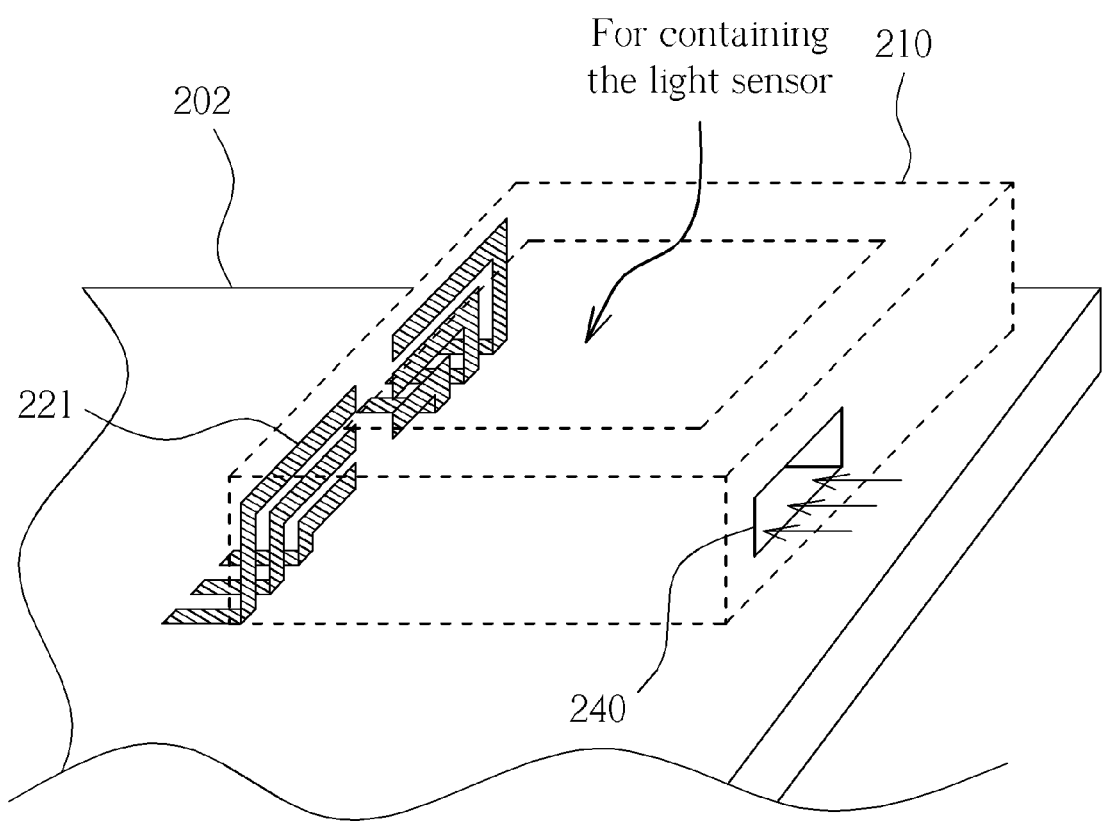

Please refer to FIG. 2. FIG. 2 is a diagram illustrating a connector 200 according to a first embodiment of the present invention. In FIG. 2, the connector 200 is disposed on a substrate 202. The substrate 202 is a transparent substrate, e.g. a glass substrate or an ITO glass. The connector 200 comprises a body 210, a connecting port 220, a lid 230, and a light-receiving window 240. The body 210 has space large enough for containing alight sensor 201, and rotates the light sensor 201 so as to change the light-receiving direction to be parallel to the substrate 202. The connecting port 220 is contained in the body 210, and is coupled to the transmission port of the light sensor 201 so that the light sensor 201 is coupled to the substrate 202 through the transmission port of the light sensor 201 and the connecting port 220. The connecting port 220 may be realized by a plurality of L-shape golden fingers 221, as shown in FIG. 3 and FIG. 4. Each golden finger 221 comprises sections $L_1$ and $L_2$. The section $L_1$ is coupled to the transmission port of the light sensor 201, and is vertical to the substrate 202. The section $L_2$ is coupled to the substrate 202, and is parallel to the substrate 202. The lid 230 is closed after the light sensor 201 is placed into the body 210 for preventing the light sensor 201 being detached from the connector 200 and from being directly pressed. The light-receiving window 240 is utilized for providing the light sensor 201 receiving light. Therefore, according to the description above-mentioned, as long as the connector 200 of the present invention is coupled to the substrate 202 and the light sensor 201 is placed into the body 210 of the connector 200, the light-receiving direction of the light sensor 201 is changed to be parallel to the substrate and the light sensor 201 can transmit the light-sensing signal $S_{LS}$ through the transmission port of the light sensor 201 and the connecting port 220 of the connector 200.

Figure 5:
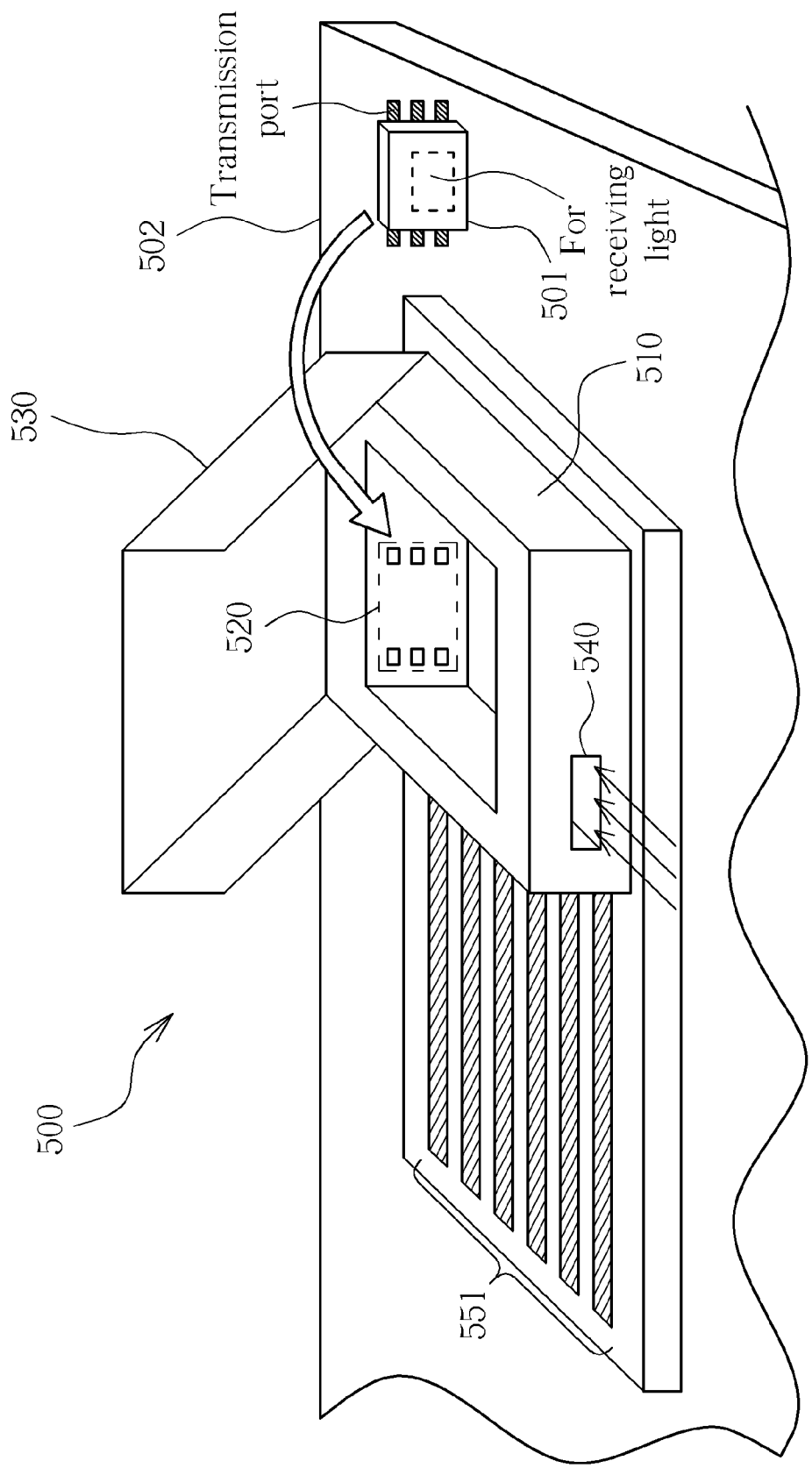
FIG. 5 is a diagram illustrating a connector according to a second embodiment of the present invention.

Please refer to FIG. 5. FIG. 5 is a diagram illustrating a connector 500 according to a second embodiment of the present invention. The operation principles and the structures of the connector 500, the light sensor 501, and the substrate 502 are respectively similar to those of the connector 200, the light sensor 201, and the substrate 202. Compared with the connector 200, the connector 500 further comprises a flexible printed circuit board (FPC) 550. The FPC 550 has a flexible-board connecting port 551. The flexible-board connecting port 551 of the FPC 550 is coupled between the connecting port 520 of the connector 500 and the substrate 502. Since, in the general fabrication of the flat display panel, the driving circuit of the display panel of is coupled to the substrate through an FPC, the fabrication of coupling the connector 500 to the substrate 502 through the FPC 550 only requires general fabrication facilities of the flat display panel.

Figure 6:
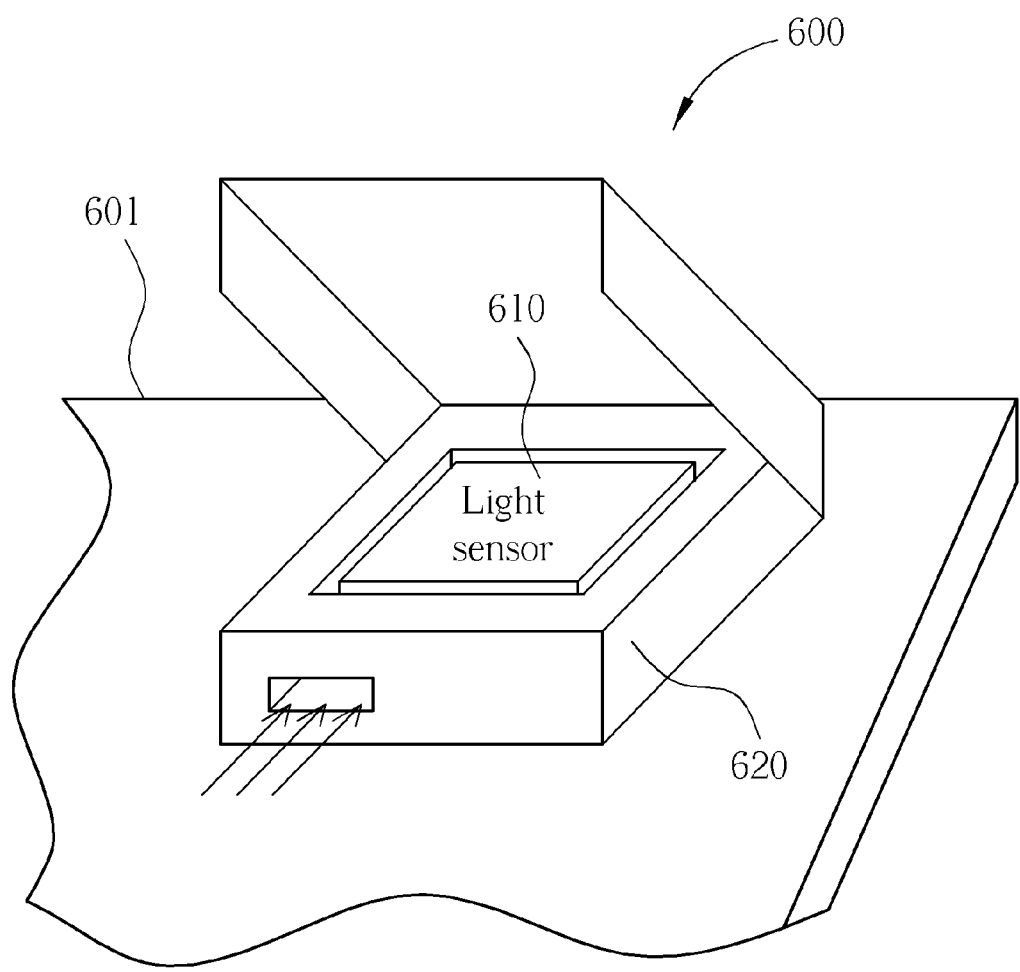
FIG. 6 is a diagram illustrating a first embodiment of the light-sensing module of the present invention.

Please refer to FIG. 6. FIG. 6 is a diagram illustrating a first embodiment of the light-sensing module of the present invention. The light-sensing module 600 comprises a light sensor 610 and a connector 620. The light sensor 610 is contained in the connector 620. The operation principles and the structures of the light sensor 610 and the connector 620 are similar to those of the light sensor 201 and the connector 200, and thus will not be repeated again for brevity. When the light-sensing module 600 is coupled to the substrate 601, the light-receiving direction of the light-sensing module 600 is parallel to the substrate 601. Hence, when the light-sensing module 600 is disposed on a substrate of an optical touch system, the light-sensing module 600 can detect the indicating object on the substrate, and accordingly generate a light-sensing signal $S_{LS}$.

Figure 7:
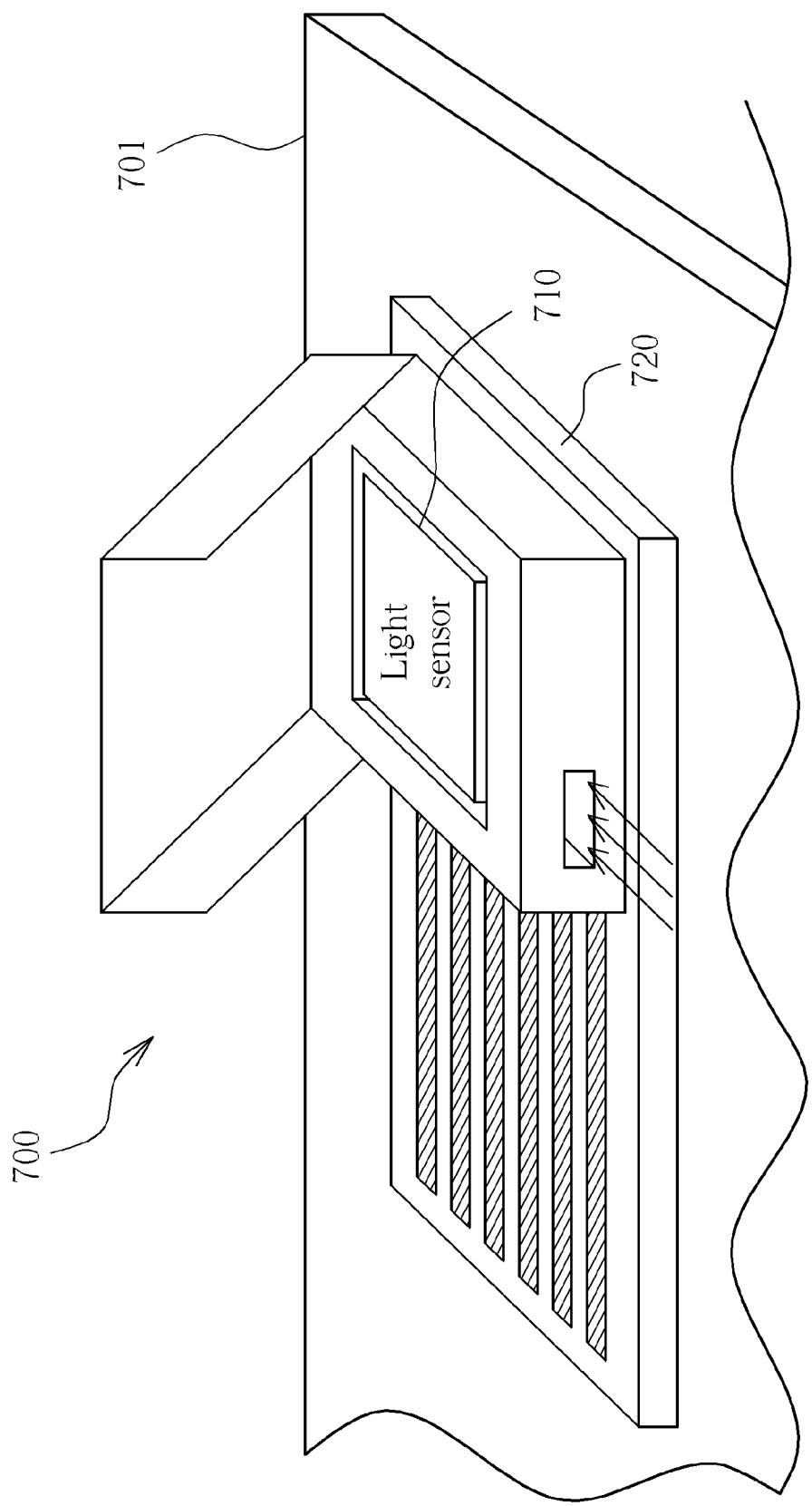
FIG. 7 is a diagram illustrating a second embodiment of the light-sensing module of the present invention.

Please refer to FIG. 7. FIG. 7 is a diagram illustrating a second embodiment of the light-sensing module of the present invention. The light-sensing module 700 comprises a light sensor 710 and a connector 720. The light sensor 710 is contained in the connector 720. The operation principles and the structures of the light sensor 710 and the connector 720 are similar to those of the light sensor 501 and the connector 500, and thus will not be repeated again for brevity. Similarly, when the light-sensing module 700 is coupled to the substrate 701, the light-receiving direction of the light-sensing module 700 is parallel to the substrate 701. As a result, when the light-sensing module 700 is disposed on a substrate of an optical touch system, the light-sensing module 700 can detect the indicating object on the substrate, and accordingly generate a light-sensing signal $S_{LS}$.

Figure 8:
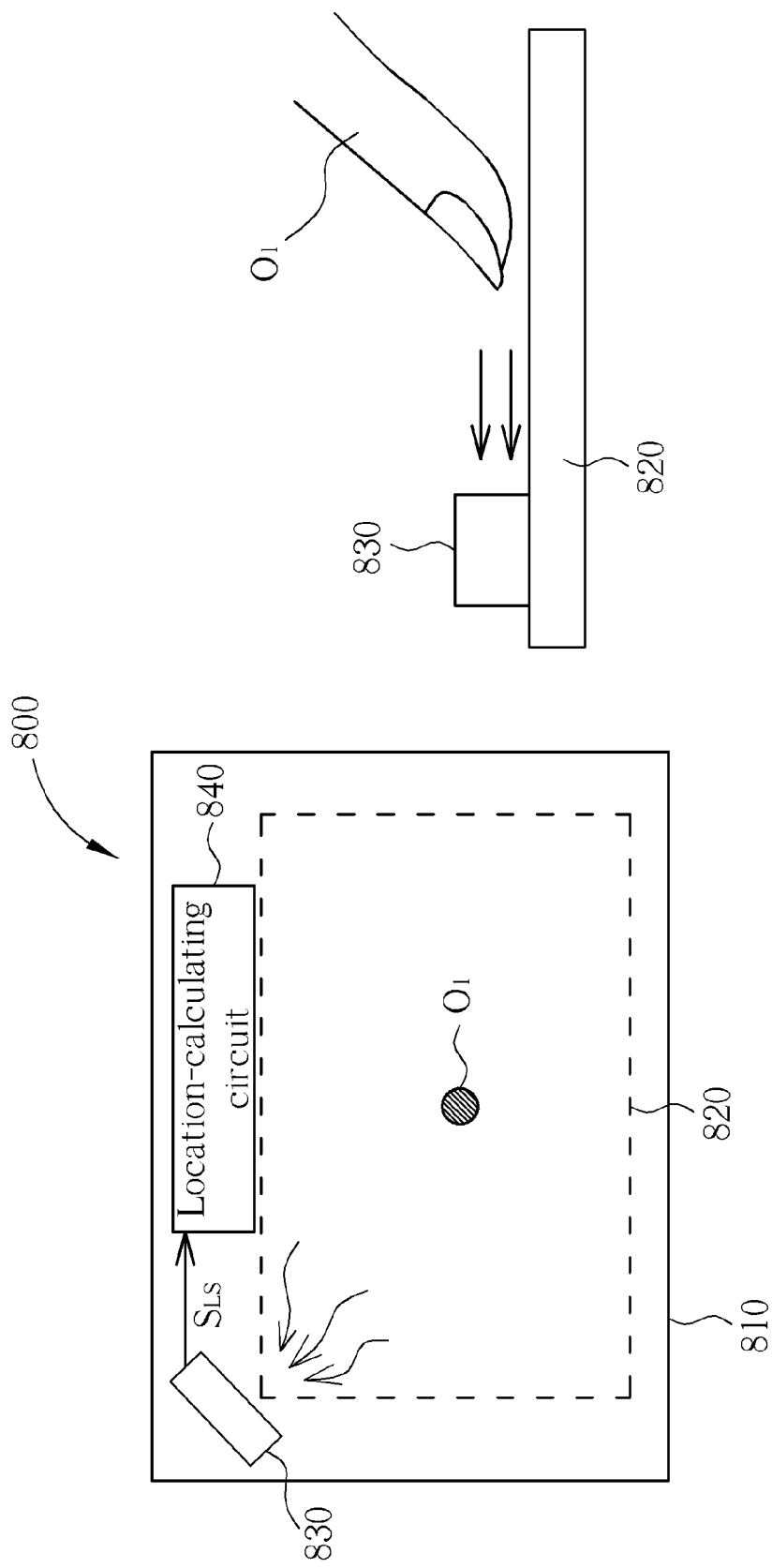
FIG. 8 is a diagram illustrating an optical touch system of the present invention.

Please refer to FIG. 8. FIG. 8 is a diagram illustrating an optical touch system 800 of the present invention. The optical touch system 800 comprises a substrate 810, a display panel 820, a light-sensing module 830, and a location-calculating circuit 840. Generally, the substrate 810 is a transparent substrate, e.g. a glass substrate or an ITO glass. The display panel 820 displays images through the substrate 810. The light-sensing module 830 may be realized by the light-sensing modules 600 or 700. The light-sensing module 830 is disposed on the substrate 810, and the light-receiving direction of the light-sensing module 830 is parallel to the substrate 810. The light-sensing module 830 receives light for detecting the indicating object $O_1$ such as a finger on the substrate 810, and accordingly generate a light-sensing signal $S_{LS}$. In this way, the location-calculating circuit 840 calculates the location of the indicating object on the display panel 820 according to the light-sensing signal $S_{LS}$ so as to realize the touch-controlled function.

In addition, it is noticeable that in the prior art, the light sensor is directly disposed on the FPC by TCP or COP, so the light sensor is processed by high temperature fabrication, e.g. reflow. Since the lens of the light sensor is not heat-resistant, the lens has to be assembled to the light sensor after the high temperature fabrication, causing an additional cost. However, by means of the connector of the present invention, the light sensor is prevented from the high temperature fabrication.

Consequently, during the fabrication of the light sensor, the lens and the other components of the light sensor are packaged at the same time to form a chip module, reducing the cost of the light sensor. The above-mentioned method of fabricating the light sensor according to the present invention is further illustrated as below.

Figure 9:
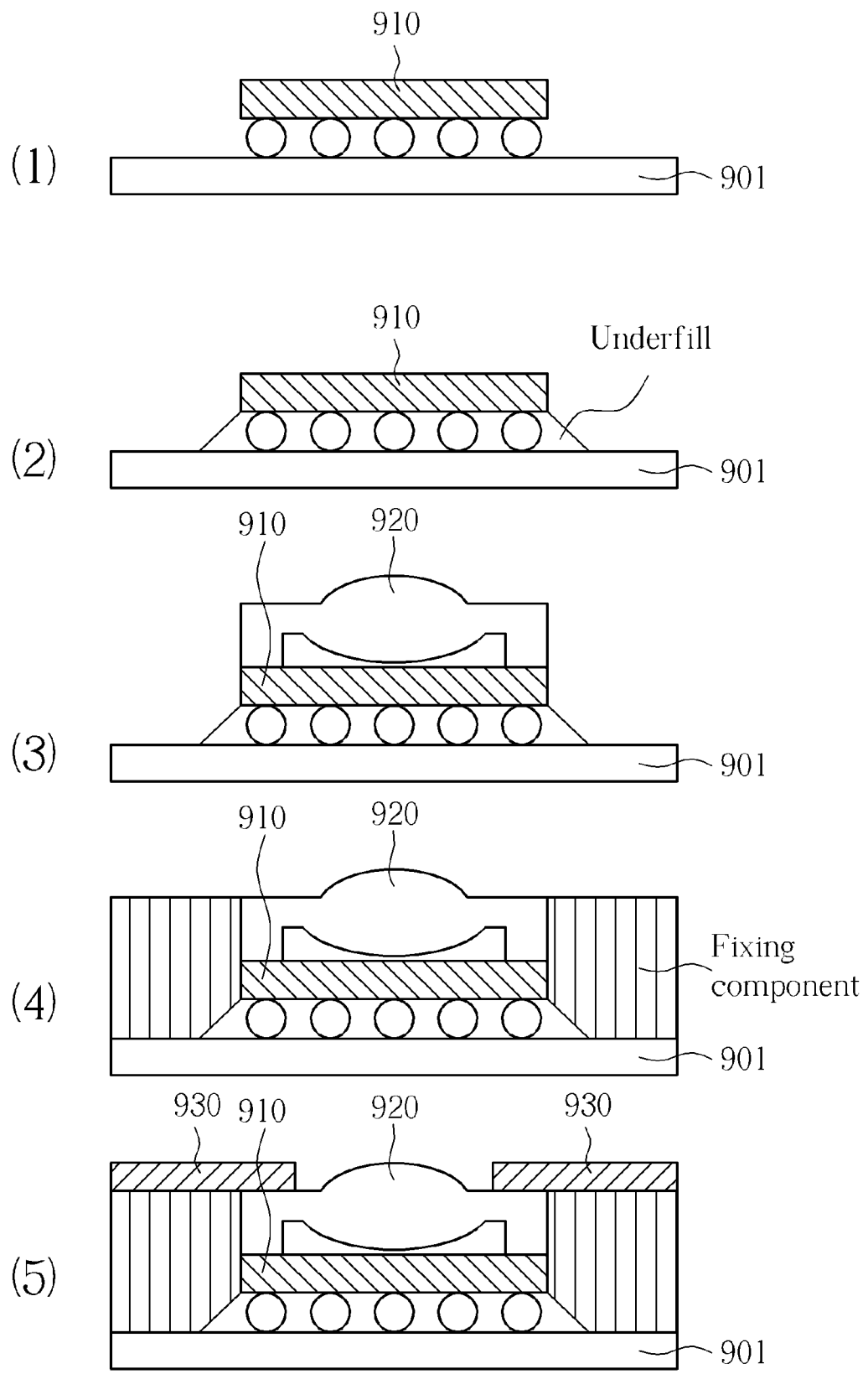
FIG. 9 and FIG. 10 are diagrams illustrating a method of fabricating a light sensor of the present invention.
Figure 10:
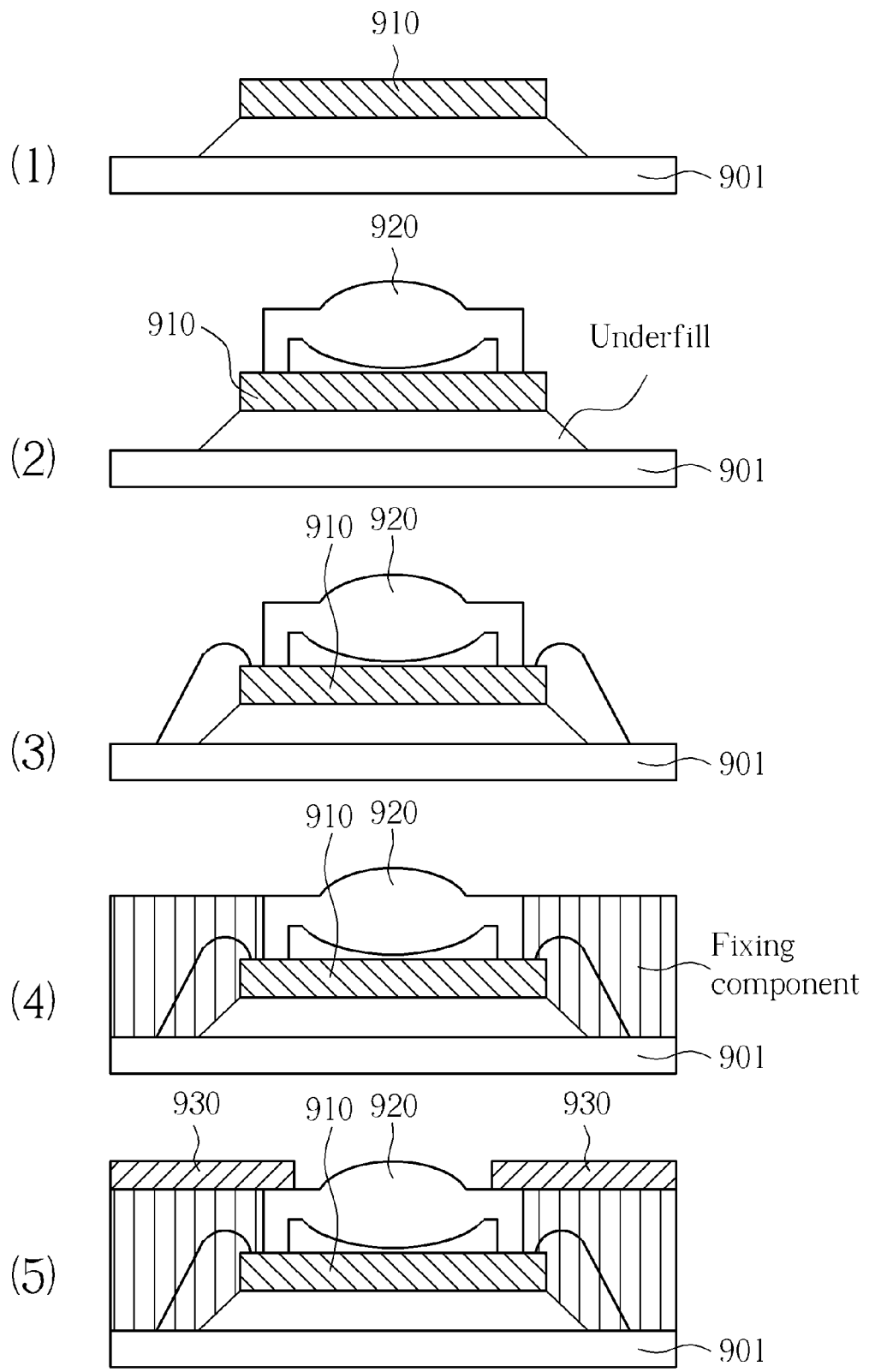

Please refer to FIG. 9 and FIG. 10. FIG. 9 and FIG. 10 are diagrams illustrating a method of fabricating a light sensor 900 of the present invention. The light sensor 900 comprises a sensing unit 910, a lens 920, and a light-blocking component 930. The sensing unit 910 is utilized for receiving light so as to generate a light-sensing signal $S_{LS}$. The sensing unit 910 has a transmission end as the transmission port of the light sensor 900. The sensing unit 910 is generally a chip of Chip Scale Package (CSP). The lens 920 is utilized for focusing the light on the sensing unit 910. The light-blocking component 930 is utilized for blocking the light not vertically entering the light sensor 900, so that the light-receiving direction of the light sensor 900 is vertical to the surface of the lens 920 and the sensing unit 910. That is, the sensing unit 910 is almost not disturbed by the light of the other direction. In addition, when the sensing unit 910 generates the light-sensing signal $S_{LS}$ mainly according to the infra-red light, the light-blocking component 930 can block the infra-red light.

In FIG. 9, the method of fabricating the light sensor 900 comprises: (1) coupling the transmission end of the sensing unit 910 to a carrying component 901 by means of surface mount technology (SMT), (2) filling an underfill between the sensing unit 910 and the carrying component 901 for fixing the sensing unit 910 to the carrying component 901, (3) attaching the lens 920 on the sensing unit 910, (4) filling a fixing component 902 around the sensing unit 910 and the lens 920 for packaging the sensing unit 910 and the lens 920, and (5) disposing a light-blocking component 930 around the lens 920 for blocking the light not vertically emitting into the surface of the light sensor 900.

In FIG. 10, the method of fabricating the light sensor 900 comprises: (1) coupling the transmission end of the sensing unit 910 to a carrying component 901 by means of SMT, (2) attaching the lens 920 on the sensing unit 910, (3) using metal wire to couple the transmission end of the sensing unit 910 to the carrying component 901, (4) filling a fixing component 902 around the sensing unit 910 and the lens 920 for packaging the sensing unit 910 and the lens 920, and (5) disposing a light-blocking component 930 around the lens 920 for blocking the light not vertically emitting into the surface of the light sensor 900.

In conclusion, the connector provided by the present invention is utilized for connecting a light sensor and a substrate, and rotating the light sensor so as to change the light-receiving direction of the light sensor to be parallel to the substrate. In this way, the light sensor can be disposed through the connector of the present invention, and keep the light-receiving direction of the light sensor parallel to the substrate at the same time. By means of the connector of the present invention, the present invention further provides a light-sensing module. When the light-sensing module of the present invention is coupled to a substrate, the light-receiving direction of the light-sensing module of the present invention is parallel to the substrate. The present invention further provides an optical touch system. In the optical touch system, the light-sensing module is parallel to the substrate. In addition, the present invention further provides a method of fabricating a light sensor by means of the connector of the present invention. Because the connector of the present invention can prevent the light sensor from high temperature fabrication, the method of the present invention packages the lens and the sensing unit of the sensor to form a chip module at the same time, reducing the cost of the light sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a light sensor, the light sensor having a sensing unit and a lens, the method comprising:
   filling an underfill between the sensing unit and a carrying component for fixing the sensing unit to the carrying component, wherein a transmission end structure of the sensing unit is contacted with and coupled to the carrying component by means of surface mount technology and the transmission end structure is covered by the underfill;
   attaching the lens on the sensing unit after the sensing unit is fixed onto the carrying component; and
   filling a fixing component around the sensing unit and the lens for packaging the sensing unit and the lens.

2. The method of claim 1, further comprising:
   disposing a light-blocking component around the lens for blocking light not vertically emitting into a surface of the light sensor.

3. The method of claim 1, further comprising:
   using metal wire to couple a transmission end of the sensing unit to the carrying component.

4. The method of claim 1, further comprising changing a light-receiving direction of the light sensor to be parallel to a substrate, wherein the substrate is an ITO glass.

5. A method of fabricating a light sensor, the light sensor having a sensing unit and a lens, the method comprising:
   filling an underfill between the sensing unit and a carrying component for fixing the sensing unit to the carrying component;
   using metal wire to couple a transmission end of the sensing unit to the carrying component, wherein the metal wire is not within the underfill;
   attaching the lens on the sensing unit; and
   filling a fixing component around the sensing unit and the lens for packaging the sensing unit and the lens.

6. The method of claim 5, further comprising:
   disposing a light-blocking component around the lens for blocking light not vertically emitting into a surface of the light sensor.

7. The method of claim 5, further comprising changing a light-receiving direction of the light sensor to be parallel to a substrate, wherein the substrate is an ITO glass.

* * * * *